United States Patent
Ha et al.

(10) Patent No.: US 10,263,184 B2
(45) Date of Patent: Apr. 16, 2019

(54) SWITCHING DEVICE AND NON-VOLATILE MEMORY DEVICE INCLUDING THE SAME

(71) Applicant: SK hynix Inc., Icheon (KR)

(72) Inventors: Tae Jung Ha, Icheon (KR); Soo Gil Kim, Seongnam (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 15/977,606

(22) Filed: May 11, 2018

(65) Prior Publication Data

US 2019/0074436 A1   Mar. 7, 2019

(30) Foreign Application Priority Data

Sep. 5, 2017 (KR) .................... 10-2017-0113297

(51) Int. Cl.
*H01L 47/00*   (2006.01)
*H01L 45/00*   (2006.01)

(52) U.S. Cl.
CPC ........ *H01L 45/1253* (2013.01); *H01L 45/145* (2013.01)

(58) Field of Classification Search
CPC .......................... H01L 45/1253; H01L 45/145
USPC .............................................................. 257/4
See application file for complete search history.

(56) References Cited

U.S. PATENT DOCUMENTS

| 8,367,463 | B2 | 2/2013 | Kumar et al. |
| 8,871,621 | B2 | 10/2014 | Ananthan et al. |
| 9,178,147 | B2 * | 11/2015 | Kuse ...................... H01L 45/146 |

* cited by examiner

Primary Examiner — Tu-Tu V Ho

(57) ABSTRACT

A switching device includes a first switching element having a snap-back behavior characteristic, an output voltage of the first switching element decreasing when an input current increases from a turn-on threshold current of the first switching element. The switching device further includes a second switching element having a continuous-resistance behavior characteristic, an output voltage of the second switching element increasing when the input current increases from a turn-on threshold current of the second switching element. The turn-on threshold current of the first switching element is lower than the turn-on threshold current of the second switching element.

20 Claims, 13 Drawing Sheets

SWITCHING DEVICE AND NON-VOLATILE MEMORY DEVICE INCLUDING THE SAME

CROSS-REFERENCE TO RELATED APPLICATION

The present application claims priority under 35 U.S.C. 119(a) to Korean Patent Application No. 10-2017-0113297, filed on Sep. 5, 2017, which is herein incorporated by reference in its entirety.

BACKGROUND

1. Technical Field

Various embodiments of the present disclosure generally relate to a switching device and a non-volatile memory device including the same.

2. Related Art

Unit cells in memory devices having high integration density have been arranged in a cross-point array structure. Specifically, a cross-point array structure may include a pillar-shaped structure formed between electrodes that intersect each other in one direction, but that extend along different planes. Various memory devices having cross-point array structures may include, for example, resistive random access memory (ReRAM) devices, phase change RAM (PcRAM) devices, magnetic RAM (MRAM) devices, and the like.

However, in a cross-point array structure, cell information stored in memory cells may have write errors and read errors, due to sneak currents occurring between adjacent memory cells. In order to suppress such errors, a selection device for controlling the sneak current in the memory cells may be arranged in the memory device. As the selection device, a volatile switching device, such as a transistor, a diode, a tunnel barrier device, an ovonic threshold switch, or the like, has been proposed.

SUMMARY

A switching device according to one aspect of the present disclosure includes a first switching element having a snap-back behavior characteristic, an output voltage of the first switching element decreasing when an input current increases from a turn-on threshold current of the first switching element. The switching device also include a second switching element having a continuous-resistance behavior characteristic, an output voltage of the second switching element increasing when the input current increases from a turn-on threshold current of the second switching element. The turn-on threshold current of the first switching element is lower than the turn-on threshold current of the second switching element. The first switching element comprises a first electrode layer, a first switching layer disposed on the first electrode layer, and a second electrode layer disposed on the first switching layer. The second switching element comprises the second electrode layer, a second switching layer disposed on the second electrode layer, and a third electrode layer disposed on the second switching layer.

A switching device according to another aspect of the present disclosure includes a first electrode, a first switching layer, a second electrode layer, a second switching layer and a third electrode layer. The first switching layer, the second electrode layer, the second switching layer and the third electrode layer are stacked on the first electrode layer. The first switching layer comprises an oxide of a first element, a dopant of a second element being distributed in the oxide of the first element, and the second switching layer comprises metal oxide that satisfies a stoichiometric ratio. The switching device has a volatile switching characteristic when a power is applied between the first electrode layer and the third electrode layer.

A non-volatile memory device according to another aspect includes a first switching element, a second switching element, and a resistive memory device. The first switching element, the second switching element, and the resistive memory device are connected to each other in series. The first switching element includes a first electrode layer, a first switching layer disposed on the first electrode layer, and a second electrode layer disposed on the first switching layer. The first switching element exhibits a snap-back behavior characteristic, an output voltage of the first switching element decreasing when an input current increases from a turn-on threshold current of the first switching element. The second switching element includes the second electrode layer, a second switching layer disposed on the second electrode layer, and a third electrode layer disposed on the second switching layer. The second switching element has a continuous-resistance behavior characteristic, an output voltage of the second switching element increasing when the input current increases from a turn-on threshold current of the second switching element. The resistive memory device includes the third electrode layer, a variable resistance layer disposed on the third electrode layer, and a fourth electrode layer disposed on the variable resistance layer.

DETAILED DESCRIPTION

Figure 1A:
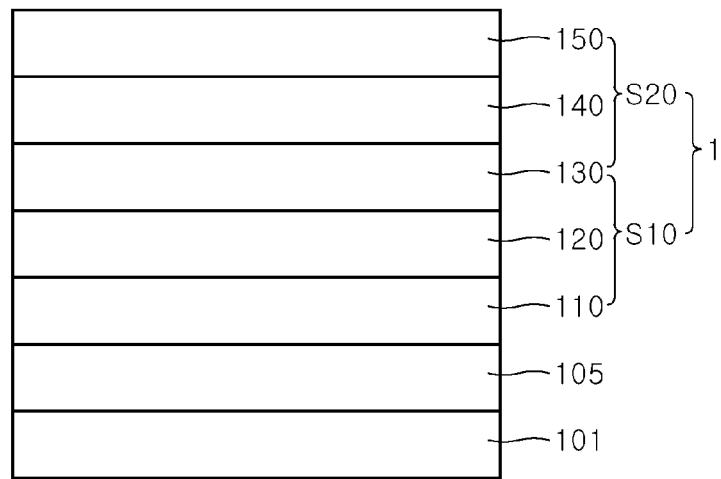
FIG. 1A is a cross-sectional view schematically illustrating a switching device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word, unless clearly used otherwise in the context. It will be understood that the terms "comprise" or "have" are intended to specify the presence of a feature, a number, a step, an operation, an element, a part, or combinations thereof, but are not used to preclude the presence or possibility of additional one or more other features, numbers, steps, operations, components, parts, or combinations thereof.

In this specification, the terms "low resistance state" and "high resistance state," with respect to the same element, should not be construed as absolute concepts indicating resistance states having predetermined resistance values, but may be construed as relative concepts with respect to each other. As an example, in a switching device, a turn-off state may mean a high resistance state and a turn-on state may mean a low resistance state. Likewise, in the specification, the terms "low resistance" and "high resistance" can be interpreted as relative concepts. A switching device may store signal information corresponding to a resistance state of the switching device, e.g., the low resistance state or the high resistance state. For example, the low resistance state or the high resistance state may correspond to signal information of "0" or "1," respectively.

Figure 1B:
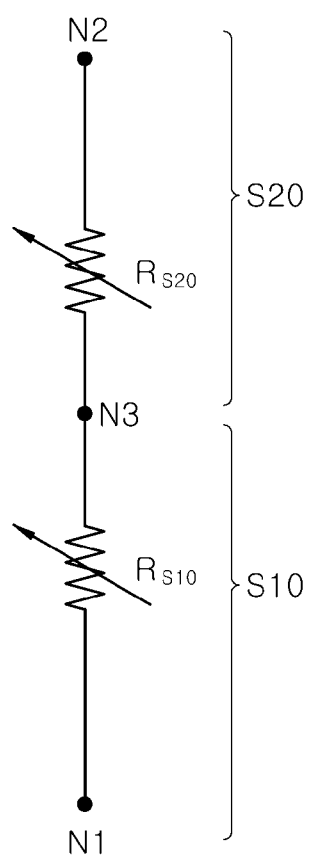
FIG. 1B is a circuit diagram of a switching device according to an embodiment of the present disclosure.

FIG. 1A is a cross-sectional view schematically illustrating a switching device 1 according to an embodiment of the present disclosure. FIG. 1B is a circuit diagram of the switching device 1 according to the embodiment of the present disclosure.

Referring to FIG. 1A, the switching device 1 may include a first switching element S10 and a second switching element S20, which are electrically connected to each other in series. As illustrated in FIG. 1B, each of the first switching element S10 and the second switching element S20 may be a variable resistance element whose electrical resistance varies depending on an electrical input applied to the variable resistance element, e.g., an applied voltage or an applied current.

As an example, an electrical input, e.g., a voltage or a current, is applied to the switching device 1. The electrical input applied to the switching device 1 can result in a first electrical input being applied to the first switching element S10 and a second electrical input being applied to the second switching element S20. Since the first and second switching elements S10 and S20 are connected in series, when the electrical input that is applied to the switching device 1 is an electrical current, the same electrical current is applied to the first and second switching elements S10 and S20.

When the first electrical input that is applied to the first switching element S10 increases to a first predetermined threshold value or greater, the first switching element S10 may be turned on, and an electrical resistance $R_{s10}$ of the first switching element S10 may decrease from a high resistance state to a low resistance state. Likewise, when the second electrical input that is applied to the second switching element S20 increases to a second predetermined threshold value or greater, the second switching element S20 may be turned on, and an electrical resistance $R_{s20}$ of the second switching element S20 may decrease from a high resistance state to a low resistance state.

However, when the first electrical input that is applied to the first switching element S10 subsequently decreases below a third predetermined threshold value, or the first electrical input is removed from the first switching element S10, the first switching element S10 is electrically turned off such that the electrical resistance $R_{s10}$ of the first switching element S10 may increase from the low resistance state to the high resistance state. Similarly, when the second electrical input that is applied to the second switching element S20 decreases below a fourth predetermined threshold value, or the second electrical input is removed from the second switching element S20, the second switching element S20 is electrically turned off such that the electrical resistance $R_{s20}$ of the second switching element S20 may increase from the low resistance state to the high resistance state. As such, each of the first and second switching elements S10 and S20 may have a volatile switching characteristic.

An operation in which a switching element, e.g., the switching element S10 or S20, changes from one resistance state to a different resistance state in response to an applied voltage or current is known as a "switching operation" or a "threshold switching operation." As described above, the switching operation can change a switching element from the high resistance state to the low resistance state, or from the low resistance state to the high resistance state, depending on whether an electrical input applied to the switching element increases above or decreases below predetermined thresholds associated with the switching element. In an embodiment, the switching operation changes the resistance state of the switching element depending on whether the electrical input applied to the switching element is above or below the predetermined thresholds. According to various embodiments of the present disclosure, information corresponding to the resistance state of the switching element that undergoes the switching operation is not stored in a non-volatile manner.

When the first and second electrical inputs, which are applied to the switching elements S10 and S20 from an initial state that the first and second switching elements S10 and S20 are turned off, increase and reach predetermined turn-on thresholds that turn on the first and second switching elements S10 and S20, the electrical resistance of the switching element S10 or S20 may start to decrease non-linearly. When the first and second electrical inputs are electrical currents, the predetermined turn-on thresholds may be referred to as "predetermined turn-on threshold currents," and when the first and second electrical inputs are electrical voltages, the predetermined turn-on thresholds may be referred to as "predetermined turn-on threshold voltages." That is, when the applied first and second electrical inputs reach the turn-on thresholds, the electrical resistances of the switching elements S10 and S20 change relatively rapidly.

Referring to FIG. 1A, the first and second switching elements S10 and S20 may be stacked on a substrate 101. The substrate 101 may be, for example, a silicon substrate, a gallium arsenide (GaAs) substrate, an indium phosphide (InP) substrate, a germanium (Ge) substrate, a silicon germanium (SiGe) substrate, or a combination thereof. In an embodiment, the substrate 101 can be a substrate which a semiconductor process can be performed on. For example, the substrate may be a ceramic substrate, a polymer substrate, a metal substrate, or a combination thereof.

An interlayer insulating layer 105 may be disposed on the substrate 101. The interlayer insulating layer 105 may include, for example, an oxide, a nitride, an oxynitride, or a combination thereof. The interlayer insulating layer 105 may electrically insulate the substrate 101 from a first electrode layer 110.

Although it is not illustrated, a structure consistent with an electrical device, such as a transistor, a diode, a capacitor, or the like, may be disposed between the substrate 101 and the interlayer insulating layer 105. In addition, an integrated circuit having at least one wiring layer may be disposed between the substrate 101 and the interlayer insulating layer 105.

The first switching element S10 may be disposed on the interlayer insulating layer 105. The first switching element S10 may include the first electrode layer 110, a first switching layer 120, and a second electrode layer 130, which are sequentially disposed on the interlayer insulating layer 105. The first electrode layer 110 may include a conductive material. The first electrode layer 110 may include, for example, tungsten (W), aluminum (Al), copper (Cu), tantalum (Ta), titanium (Ti), gold (Au), platinum (Pt), silver (Ag), ruthenium (Ru), iridium (Ir), molybdenum (Mo), tungsten nitride, titanium nitride, tantalum nitride, doped silicon, or a combination thereof.

The first switching layer 120 may include a material that can be selectively insulative or conductive depending on an external voltage or current applied to the material. In one embodiment, the first switching layer 120 may include an oxide of a first element, and dopants of a second element, which are distributed in the oxide of the first element. Here, the valence of the first element may be different from the valence of the second element. The oxide of the first element may include, for example, silicon oxide, aluminum oxide, zirconium oxide, hafnium oxide, tungsten oxide, titanium oxide, nickel oxide, copper oxide, manganese oxide, tantalum oxide, niobium oxide, iron oxide, or a combination thereof. The second element may include, for example, carbon (C), nitrogen (N), phosphorus (P), arsenic (As), aluminum (Al), lanthanum (La), niobium (Nb), vanadium (V), tantalum (Ta), tungsten (W), chromium (Cr), molybdenum (Mo), titanium (Ti), copper (Cu), zirconium (Zr), hafnium (Hf), or a combination thereof.

The second electrode layer 130 may be disposed on the first switching layer 120. The second electrode layer 130 may include a conductive material. The second electrode layer 130 may include, for example, tungsten (W), aluminum (Al), copper (Cu), tantalum (Ta), titanium (Ti), gold (Au), platinum (Pt), silver (Ag), ruthenium (Ru), iridium (Ir), molybdenum (Mo), tungsten nitride, titanium nitride, tantalum nitride, doped silicon, or a combination thereof. The second electrode layer 130 may include the same one or more materials as the first electrode layer 110, may include a different material from the first electrode layer 110, or both.

When a first electrical input, e.g., a voltage or a current, is applied between the first electrode layer 110 and the second electrode layer 130, the resistance state of the first switching element S10 may change according to the first electrical input. Specifically, the first switching element S10 may maintain a relatively high resistance state when the applied first electrical input is lower than a predetermined threshold, and may switch to a relatively low resistance state when the applied first electrical input is equal to or higher than the predetermined threshold.

The reasons that the resistance state of the first switching layer 120 changes in response to the applied first electrical input are not necessarily explained by one theory. According to any one of various theories, the dopants of the second element may form a plurality of trap sites that trap conductive carriers, such as electrons or holes, in the oxide of the first element. When the externally applied first electrical input is lower than the threshold, the plurality of trap sites may trap the conductive carriers, and may block an operation current from flowing and conducting through the conductive carriers. When the externally applied first electrical input increases to a level that is equal to or greater than the predetermined threshold, the plurality of trap sites may act as a conduction path for the conductive carriers. That is, the conductive carriers can pass through the oxide of the first element via the plurality of trap sites when the first electrical input exceeds the predetermined threshold. The conductive carriers conduct through the trap sites via a relatively low energy barrier. Accordingly, the operation current caused by the carrier conduction may increase non-linearly when the externally applied first electrical input increases to the predetermined threshold.

However, the first switching element S10 may also have a "snap-back behavior characteristic," which is defined as a characteristic of a switching element wherein a voltage output by the switching element (an "output voltage") suddenly decreases, even though a current applied to the switching element (an "input current") is increasing. For example, the first switching element S10 exhibits a snap-back behavior when an input current of the first switching element S10 increases in a predetermined input current range, but an output voltage of the first switching element S10 decreases. The snap-back behavior characteristic is illustrated in a graph of FIG. 2B, which is described below. The amount of the output voltage that decreases in accordance with the snap-back behavior is represented as '$\Delta V_{SB}B$' in FIG. 2B.

In some embodiments, the output voltage of the first switching element S10 may have a voltage value that is lower than a turn-on threshold voltage $V_{th1}$ of the first switching element S10, after the first switching element S10 is turned on. As a result, a range of a read voltage applicable to a non-volatile memory device including the first switching element S10 may be reduced. For example, comparing a non-volatile memory device 3 of FIG. 7B as a comparative example with a non-volatile memory device 2 of FIG. 6B as an embodiment that will be described below, the comparative example of FIG. 7B may have a relatively reduced second read voltage range $V_r$ of FIG. 6B or the comparative example of FIG. 7B may not have the second read voltage range $V_r$ of FIG. 6B due to the snap-back behavior characteristic of a switching device 50. Therefore, a total read voltage range $\Delta V_{rd}$ including the second read voltage range $V_r$ may be decreased in the comparative example compared with the embodiment of the present disclosure.

Referring again to FIG. 1A, the second switching element S20 may be disposed on the first switching element S10. The second switching element S20 may include the second electrode layer 130, a second switching layer 140, and a third electrode layer 150, which are sequentially disposed over the first switching element S10. The second switching element S20 may share the second electrode layer 130 with the first switching element S10.

The second switching layer 140 may include a material that can be electrically insulative or electrically conductive depending on an external voltage or current applied to the material. In one embodiment, the second switching layer 140 may include a metal oxide that satisfies a stoichiometric ratio. The second switching layer 140 may include, for example, titanium oxide ($TiO_2$), aluminum oxide ($Al_2O_3$), nickel oxide (NiO, $NiO_2$, $Ni_2O_3$), copper oxide ($Cu_2O$, CuO), zirconium oxide ($ZrO_2$), manganese oxide (MnO, $MnO_2$, $Mn_2O_3$, $Mn_3O_4$, $Mn_2O_7$), hafnium oxide ($HfO_2$), tungsten oxide (WO, $WO_2$, $WO_3$, $W_2O_3$), tantalum oxide ($Ta_2O_5$), niobium oxide ($Nb_2O_5$), iron oxide (FeO, $Fe_2O_3$, $Fe_3O_4$), or a combination thereof. The above-described nickel oxide, copper oxide, manganese oxide, tungsten oxide, and iron oxide may each have any one of the above-listed plural formulas.

The second switching layer 140 may have a "tunneling conduction characteristic," which refers to a characteristic of a layer wherein the layer generates carrier conduction through a tunneling effect. For example, the second switching layer 140 may generate a relatively low density of a current corresponding to a leakage current level due to a relatively low tunneling probability when the applied voltage or current is lower than a predetermined threshold voltage or a predetermined threshold current. When the applied voltage or current is greater than or equal to the predetermined threshold voltage or current, conductive carriers may conduct through the second switching layer 140 at an operation current with a relatively high current density, because a tunneling width is reduced by an energy band bending phenomenon. As an example, when an applied current is less than a threshold current $I_{th2}$, the increment of an output voltage according to an increase of the applied current may be relatively large, whereas when the applied current is equal to or higher than the threshold current $I_{th2}$, the increment of the output voltage according to the increase of the applied current may be relatively small. In other words, the rate of change of the output voltage with respect to the applied current is larger when the applied current is less than the threshold current $I_{th2}$, than when the applied current is greater than the threshold current $I_{th2}$.

The third electrode layer 150 may include a conductive material. The third electrode layer 150 may include, for example, tungsten (W), aluminum (Al), copper (Cu), tantalum (Ta), titanium (Ti), gold (Au), platinum (Pt), silver (Ag), ruthenium (Ru), iridium (Ir), molybdenum (Mo), tungsten nitride, titanium nitride, tantalum nitride, doped silicon, or a combination thereof. The third electrode layer 150 may include the same one or more materials as the second electrode layer 130, a different material from the second electrode layer 130, or both.

As described above, the switching device 1 according to the embodiment of the present disclosure may include the first switching element S10 and the second switching element S20, which are electrically connected to each other in series. The first switching element S10 and the second switching element S20 may each have a volatile switching characteristic. However, the carrier conduction characteristic of each of the first and second switching elements S10 and S20 may be different from each other, as described below.

Figure 2A:
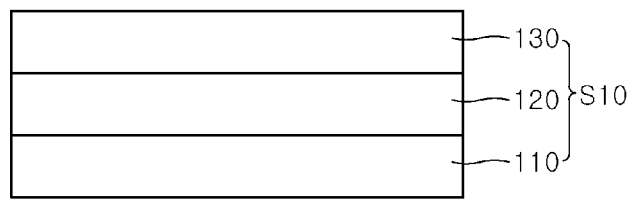
FIG. 2A is a cross-sectional view schematically illustrating a first switching element according to an embodiment of the present disclosure.
Figure 2B:
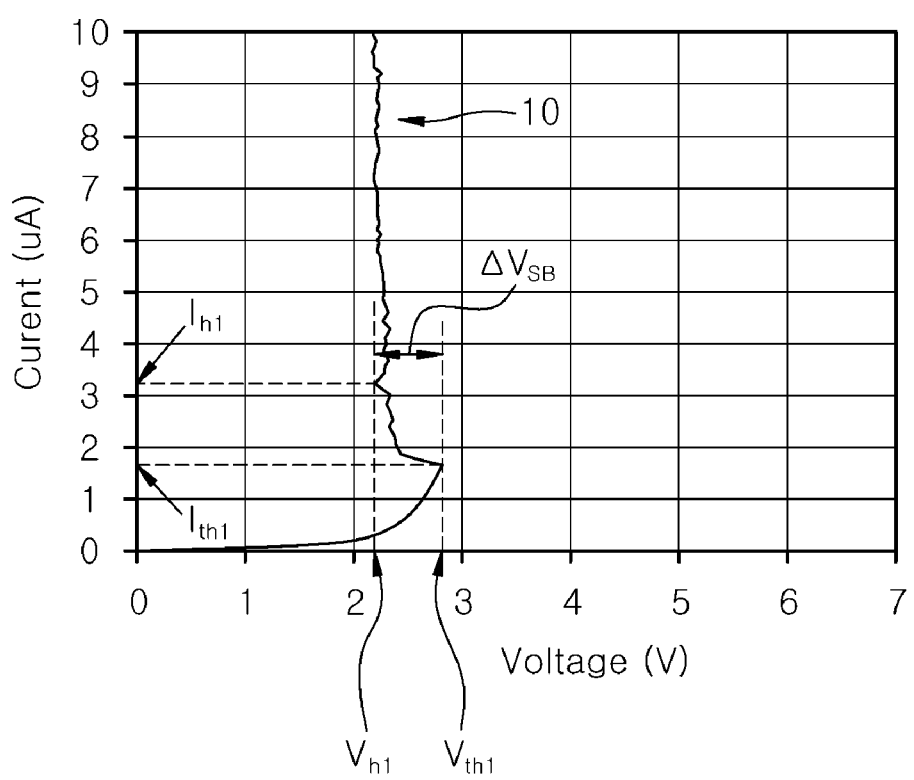
FIG. 2B is a graph illustrating a current-voltage characteristic of the first switching element of FIG. 2A according to an embodiment of the present disclosure.

FIG. 2A is a cross-sectional view schematically illustrating a first switching element S10 according to an embodiment of the present disclosure. FIG. 2B is a graph illustrating a current-voltage characteristic of the first switching element S10 of FIG. 2A according to an embodiment of the present disclosure.

The first switching element S10 illustrated in FIG. 2A may be substantially the same in configuration as the first switching element S10 of the switching device 1, which is described above with reference to FIG. 1A. FIG. 2B illustrates a current-voltage characteristic of the switching element S10. That is, FIG. 2B is a graph illustrating an output voltage of the first switching element S10 of FIG. 2A, which is generated when an input current is applied to the first switching element S10. Specifically, FIG. 2B illustrates the output voltage when the input current is swept up from 0 A.

In a specific embodiment, the switching element S10 includes a switching layer 120 that is a boron-doped silicon oxide layer with a thickness of about 100 Å, and includes first and second electrode layers 110 and 130 that are each a titanium nitride layer.

Referring to FIG. 2B, the input current is applied between the first electrode layer 110 and the second electrode layer 130, and is swept up from 0 A. That is, the input current increases from 0 A. The output voltage may increase at a relatively great rate of change with respect to the input current, from 0 V to about 2.8 V, until the applied input current reaches about 1.6 µA. Accordingly, it is observed that the resistance of the first switching layer 120 is relatively large when the input current ranges from 0 to 1.6 µA, compared to when the input current is greater than 1.6 µA. That is, the first switching layer 120 may maintain a high resistance state when the input current ranges from 0 to 1.6 µA.

When the input current reaches about 1.6 µA, the first switching layer 120 may switch from the high resistance state to a low resistance state, and the output voltage may decrease relatively rapidly. The input current and the output voltage, at the instant when the output voltage begins to decrease, are referred to as a "turn-on threshold current $I_{th1}$" and a "turn-on threshold voltage $V_{th1}$," respectively. As such, the phenomenon in which the output voltage decreases when the input current reaches the turn-on threshold current $I_{th1}$ can be referred to as a "snap-back behavior." After the snap-back behavior occurs, the output voltage does not increase again to the turn-on voltage $V_{th1}$ or greater, even if the input current increases. In other words, when the input current reaches the turn-on threshold current $I_{th1}$, the first switching element S10 is turned on, and the output voltage is maintained at a magnitude that is less than the turn-on threshold voltage $V_{th1}$.

The output voltage of the first switching element S10 can be maintained at a level that is within a certain range after the snap-back behavior occurs. The minimum output voltage at which the first switching element S10 can maintain a stable turn-on state may be referred to as a "turn-on hold voltage $V_{h1}$." The applied input current when the output voltage is equal to the turn-on hold voltage $V_{h1}$ may be referred to as a "turn-on hold current 41".

Referring again to FIG. 2B, the voltage difference between the turn-on threshold voltage $V_{th1}$ and the turn-on hold voltage $V_{h1}$ may be referred to as a "snap-back voltage $\Delta V_{SB}$." In an embodiment, the snap-back voltage $\Delta V_{SB}$ of the first switching element S10 may be proportional to the thickness of the first switching layer 120. In an embodiment, the magnitude of the turn-on threshold voltage $V_{th1}$ and the magnitude of the snap-back voltage $\Delta V_{SB}$ may each be proportional to the thickness of the first switching layer 120.

Figure 3A:
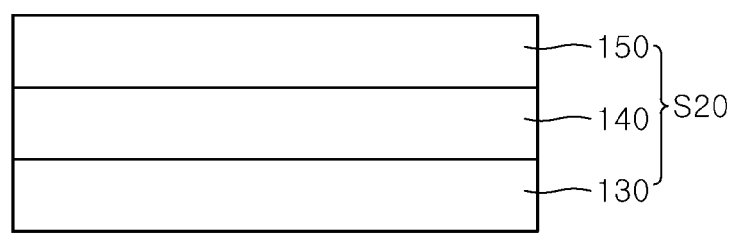
FIG. 3A is a cross-sectional view schematically illustrating a second switching element according to an embodiment of the present disclosure.
Figure 3B:
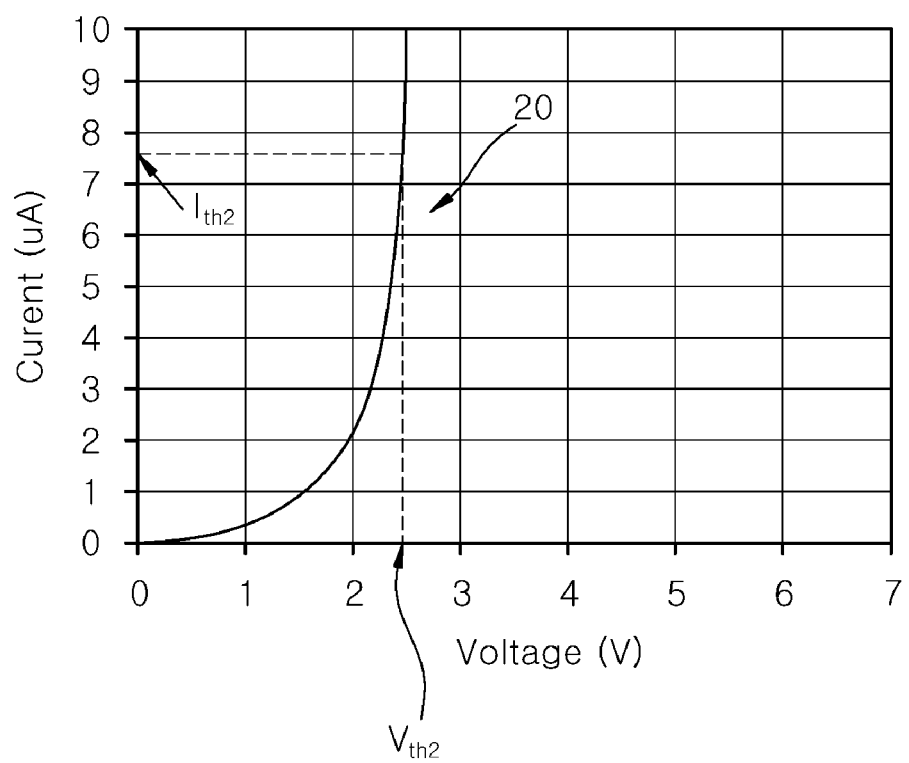
FIG. 3B is a graph illustrating a current-voltage characteristic of the second switching element of FIG. 3A according to an embodiment of the present disclosure.

FIG. 3A is a cross-sectional view schematically illustrating a second switching element S20 according to an embodiment of the present disclosure. FIG. 3B is a graph illustrating a current-voltage characteristic of the second switching element S20 of FIG. 3A according to an embodiment.

The second switching element S20 illustrated in FIG. 3A may be substantially the same in configuration as the second switching element S20 described above with reference to FIG. 1A. FIG. 3B illustrates a current-voltage characteristic of the second switching element S20 of FIG. 3A. FIG. 3B is a graph illustrating an output voltage of the second switching element S20, which is generated when an input current is applied to the second switching element S20. Specifically, FIG. 3B illustrates the output voltage when the input current is swept up from 0 A.

In the specific embodiment illustrated in FIG. 3A, the switching element S20 includes a switching layer 140 that is a niobium oxide ($NbO_2$) layer with a thickness of about 150 Å, and includes second and third electrode layers 130 and 150 that are titanium nitride layers.

Referring to FIG. 3B, the input current is applied between the second electrode layer 130 and the third electrode layer 150, while the input current is swept up from 0 A. In other words, the input current increases from 0 A. The output voltage may gradually increase from 0 V to about 2.5 V, until the applied input current reaches about 7.6 µA. The second switching layer 140 can maintain a high resistance state when the applied input current increases from 0 A to about 7.6 µA.

When the input current reaches about 7.6 µA, the second switching layer 140 can switch from the high resistance state to a low resistance state. Accordingly, the rate of change of the output voltage with respect to the input current can be relatively lower when the input current is about 7.6 µA or greater, than when the input current is less than 7.6 µA. Specifically, the rate of change greatly decreases when the input current is within a range including 7.6 µA as a lower boundary.

The input current and the output voltage at the instance when the rate of change of the output voltage with respect to the input current greatly decreases are referred to as a "turn-on threshold current $I_{th2}$" and a "turn-on threshold voltage $V_{th2}$," respectively. Referring to FIG. 3B, the output voltage may continuously increase as the input current increases from 0 A over the turn-on threshold current $I_{th2}$.

The second switching element S20 has a "continuous-resistance characteristic," which is defined as a characteristic in which an element has a continuously increasing output voltage in response to a continuously increasing input current. As illustrated in FIG. 3B, the second switching element S20 does not exhibit the snap-back behavior described above with reference to FIG. 2B. As described above, the output voltage of the second switching element S20 tends to increase as the applied input current increases.

Figure 4:
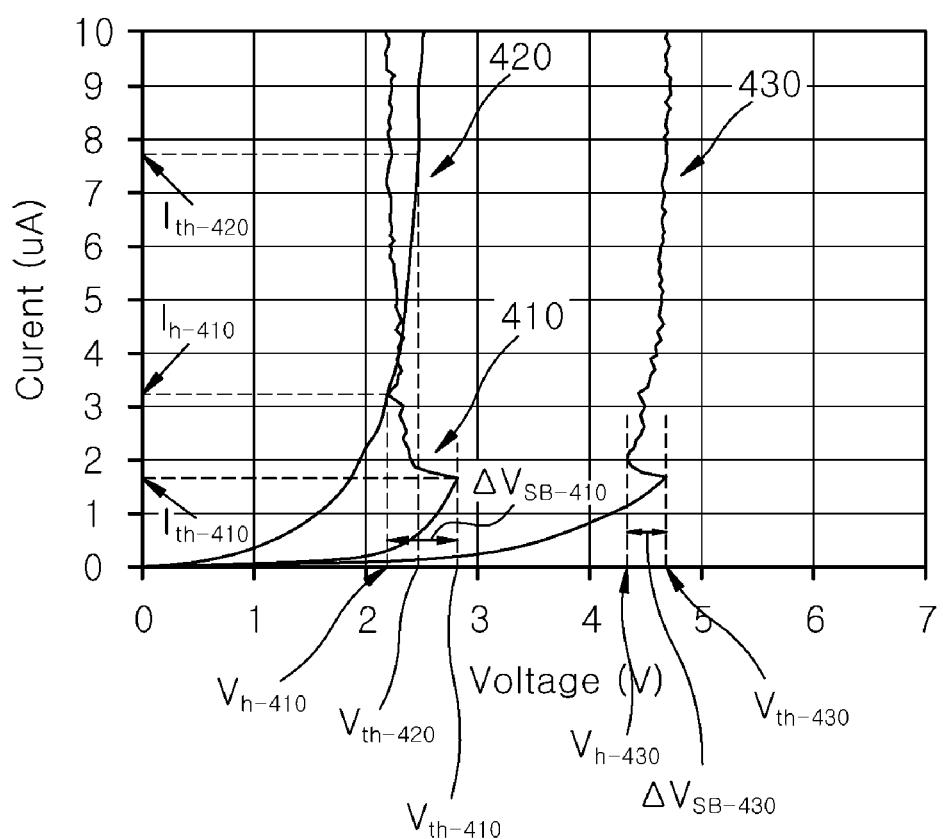
FIG. 4 is a graph illustrating a current-voltage characteristic of a switching device according to an embodiment of the present disclosure.

FIG. 4 is a graph illustrating a current-voltage characteristic of a switching device according to an embodiment of the present disclosure. In the graph of FIG. 4, a first graph 410 represents the current-voltage characteristic of the first switching element S10 described with reference to FIGS. 2A and 2B, a second graph 420 represents the current-voltage characteristic of the second switching element S20 described with reference to FIGS. 3A and 3B, and a third graph 430 represents a current-voltage characteristic of a switching device 1 formed by electrically connecting the first switching element S10 to the second switching element S20 in series.

The switching device 1 of the third graph 430 may be substantially the same in configuration as the switching device 1 described above with reference to FIGS. 1A and 1B. For example, the switching device 1 of the third graph 430 may include a first switching layer 120 that is a boron-doped silicon oxide layer with a thickness of 100 Å, and may include a second switching layer 140 that is a niobium oxide layer $NbO_2$ with a thickness of 150 Å. That is, the third graph 430 illustrates the output of the switching device 1, which includes both the first and second switching layers 120 and 140, when each of the first and second switching layers 120 and 140 has a thickness of about 100 Å to about 200 Å.

The first, the second, and the third graphs 410, 420, and 430 respectively illustrate the output voltages generated when the same input current is applied to the first and second switching elements S10 and S20, as well as the switching device 1. FIG. 4 illustrates the output voltages of the first switching element S10, the second switching element S20, and the switching device 1 including the first and second switching elements S10 and S20, when the input current is swept up from 0 A.

Referring to FIG. 4, it can be seen that because the first switching element S10, which has the snap-back voltage $\Delta V_{SB-410}$ of the first graph 410, is connected in series with the second switching element S20, which does not exhibit a snap-back behavior as shown in the second graph 420, the snap-back voltage $\Delta V_{SB-430}$ generated in the switching device 1 of the third graph 430, which includes the first and second switching elements S10 and S20, is lower than the snap-back voltage $\Delta V_{SB-410}$ of the first graph 410.

The turn-on threshold current $I_{th-410}$ of the first switching element S10, as shown by the first graph 410, may be lower than the turn-on threshold current $I_{th-420}$ of the second switching element S20, as shown by the second graph 420. On the other hand, the turn-on threshold voltage $V_{th-410}$ of the first switching element S10 may be higher than the turn-on threshold voltage $V_{th-420}$ of the second switching element S20. Referring to FIG. 4, the first switching element S10 may have a turn-on threshold voltage $V_{th-410}$ of about 2.8 V and a turn-on threshold current $I_{th-410}$ of about 1.6 µA, and the second switching element S20 may have a turn-on threshold voltage $V_{th-420}$ of about 2.5 V and a turn-on threshold current $I_{th-420}$ of about 7.6 µA.

Comparing the first switching element S10 with the second switching element S20, the electrical resistance of the first switching element S10 in a turn-off state is relatively higher than the electrical resistance of the second switching element S20 in a turn-off state, so that the first switching element S10 greatly suppresses a leakage current generated by the second switching element S20. However, a hold voltage $V_{h-410}$ after the first switching element S10 is turned on may be lower than the turn-on threshold voltage $V_{th-420}$ of the second switching element S20, because the first switching element S10 exhibits the snap-back behavior, as described above.

A range of a read voltage that is applicable to a non-volatile memory device including the first switching element S10 without the second switching element S20, is relatively narrow, and a voltage margin of the device during a read operation may be relatively small, as shown by the first and second graphs 710 and 720 of FIG. 7B described below.

On the other hand, the second switching element S20 does not exhibit the snap-back behavior, but the turn-on threshold current $I_{th\text{-}420}$ of the second switching element S20 is higher than the turn-on threshold current $I_{th\text{-}410}$ of the first switching element S10. Therefore, the electrical resistance of the second switching element S20 in the turn-off state is lower than the electrical resistance of the first switching element S10 in the turn-off state, and thus, a relatively high-density leakage current may be generated in the second switching element S20 when the second switching element S20 is in the turn-off state.

As described above, since the switching device 1 may include the first switching element S10 and the second switching element S20, which are connected to each other in series, the configurations of the first and second switching layers 120 and 140 of the first and second switching elements S10 and S20, respectively, may be controlled in order to optimize a leakage current characteristic and a turn-on current characteristic of the switching device 1, while suppressing a snap-back behavior of the switching device 1. As an example, the leakage current of the switching device 1 and the turn-on threshold voltage of the first switching element S10 can be controlled by controlling the thickness of the first switching layer 120. As the thickness of the first switching layer 120 is increased, the leakage current of the first switching element S10 can be reduced, and the turn-on threshold voltage of the first switching element S10 can increase. As another example, the snap-back voltage of the first switching element S10 can be controlled by controlling a thickness ratio of the second switching layer 140 and the first switching layer 120. As a ratio of the thickness of the second switching layer 140 to the thickness of the first switching layer 120 increases, the snap-back voltage of the first switching element S10 can be reduced.

The characteristics of the first and second switching elements S10 and S20 in the switching device 1 may be optimized in order to satisfy a specific condition. In one embodiment, when the switching device 1 is operating in an input current range in which the first switching element S10 exhibits the snap-back behavior characteristic (e.g., the current range of $I_{th\text{-}410}$ to $I_{h\text{-}410}$), the second switching element S20 may have an output voltage that maintains the turn-off state (i.e., a voltage equal to or lower than $V_{th\text{-}420}$). In one embodiment, the turn-on hold current $I_{h\text{-}410}$ of the first switching element S10 may be lower than the turn-on threshold current $I_{th\text{-}420}$ of the second switching element S20. Therefore, when the switching device 1 is operating in the input current range of $I_{th\text{-}410}$ to $I_{h\text{-}410}$, the second switching element S20 is maintained in the turn-off state until the input current reaches the turn-on threshold current $I_{th\text{-}420}$ of the second switching element S20.

The electrical resistance of the second switching element S20 may decrease non-linearly after the input current increases and reaches the turn-on threshold current $I_{th\text{-}420}$. When the input current is over the turn-on threshold current $I_{th\text{-}420}$, the rate at which the output voltage changes according to the input current may rapidly decrease in the second switching element S20.

In one embodiment, the switching device 1 may be designed with specific characteristics by controlling the thicknesses of the first and second switching layers 120 and 140 of the first and second switching elements S10 and S20, controlling a dopant doping process for manufacturing the first switching element S10 and S20, or both.

The switching device 1, which includes the first switching element S10 and the second switching element S20, may have a turn-on threshold voltage $V_{th\text{-}430}$ of about 4.6 V and a snap-back voltage $V_{SB\text{-}430}$ of about 0.3 V, as shown by the third graph 430 of FIG. 4.

Figure 5A:
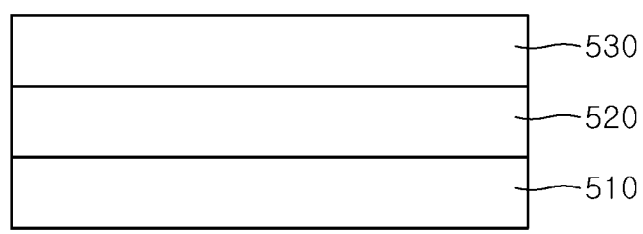
FIG. 5A is a cross-sectional view schematically illustrating a switching device according to a comparative example of the present disclosure.
Figure 5B:
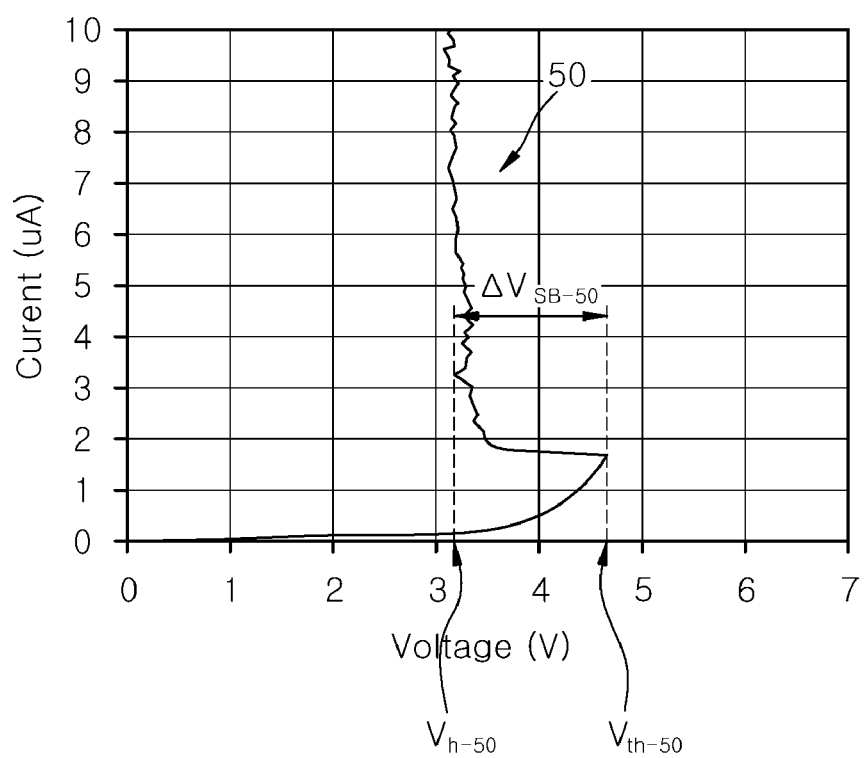
FIG. 5B is a graph illustrating a current-voltage characteristic of the switching device of FIG. 5A according to a comparative example of the present disclosure.

FIG. 5A is a cross-sectional view schematically illustrating a switching device 50 according to a comparative example of the present disclosure. FIG. 5B is a graph illustrating a current-voltage characteristic of the switching device 50 of FIG. 5A according to a comparative example of the present disclosure. That is, FIG. 5B illustrates an output voltage generated by applying an input current to the switching device 50 of FIG. 5A, while the input current is being swept up from 0 A.

Referring to FIG. 5A, the switching device 50 may include a first electrode layer 510, a switching layer 520, and a second electrode layer 530. The configuration of the switching device 50 may be substantially the same as the configuration of the first switching element S10 described above with reference to FIG. 2A. The switching layer 520 may have a specific thickness, such that a turn-on threshold voltage $V_{th\text{-}50}$ of the switching device 50 is substantially the same value as the turn-on threshold voltage $V_{th\text{-}430}$ of the switching device 1 described above with reference to FIG. 4. The switching layer 520 of the switching device 50 may be a boron-doped silicon oxide layer having a thickness of 200 Å. In addition, the first and second electrode layers 510 and 530 of the switching device 50 may be titanium nitride layers.

As illustrated by the graph of FIG. 5B, the switching device 50 has a turn-on threshold voltage $V_{th\text{-}50}$ of about 4.6 V, and has a snap-back voltage $\Delta V_{SB\text{-}50}$ of about 1.2 V. The snap-back voltage $\Delta V_{SB\text{-}50}$ of the switching device 50 is higher than the snap-back voltage $\Delta V_{SB\text{-}430}$ of the switching device 1 shown in FIG. 4, even though the switching device 50 shares substantially the same turn-on threshold voltage as the switching device 1. Therefore, the switching device 50 of the comparative example may exhibit a worse snap-back behavior than the switching device 1. For example, a range of a suitable read voltage for a non-volatile memory device 3 having the switching device 50 of the comparative example is narrower than a range of a suitable read voltage for a non-volatile memory device 2 having the switching device 1 described with reference to FIGS. 6A, 6B, 7A, and 7B.

Figure 6A:
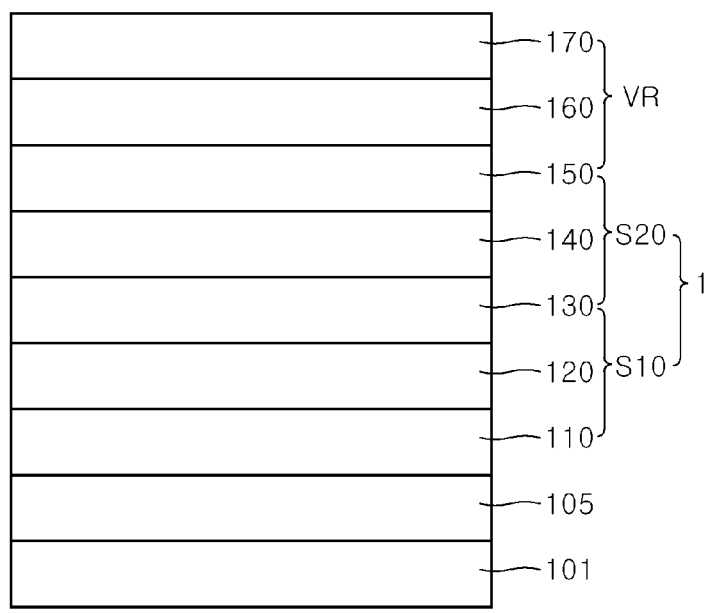
FIG. 6A is a cross-sectional view schematically illustrating a non-volatile memory device according to an embodiment of the present disclosure.
Figure 6B:
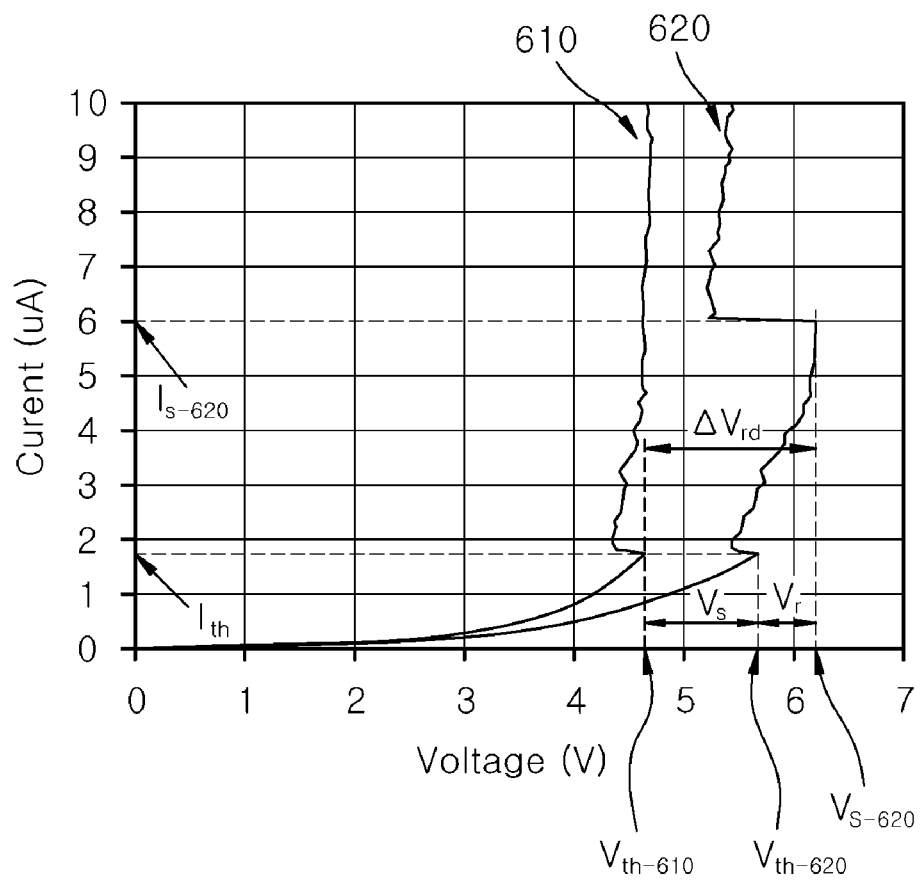
FIG. 6B is a graph illustrating a current-voltage characteristic of the non-volatile memory device of FIG. 6A according to an embodiment of the present disclosure.

FIG. 6A is a cross-sectional view schematically illustrating a non-volatile memory device 2 according to an embodiment of the present disclosure. FIG. 6B is a graph illustrating a current-voltage characteristic of the non-volatile memory device 2 of FIG. 6A according to an embodiment of the present disclosure.

Referring to FIG. 6A, the non-volatile memory device 2 may include a switching device 1 and a resistive memory device VR. The switching device 1 may function as a selection device, and the resistive memory device VR may function as a non-volatile memory device. The switching device 1 may include a first switching element S10 and a second switching element S20, which are connected to each other in series.

As an example, the non-volatile memory device 2 may have a structure in which the resistive memory device VR is stacked on the switching device 1 that is described above with reference to FIGS. 1A and 1B. The resistive memory device VR may include a third electrode layer 150, a variable resistance layer 160, and a fourth electrode layer 170, which are sequentially stacked on the second switching element S20. The resistive memory device VR may share the third electrode layer 160 with the second switching element S20.

As described above with reference to FIG. 2B, the first switching element S10 may have a snap-back behavior characteristic. That is, an output voltage of the first switching element S10 may snap back when an input current is applied between a first electrode layer 110 and a second electrode layer 130, and the input current is swept up from 0 A. As described above with reference to FIG. 3B, an output voltage of the second switching element S20 may continuously increase when an input current is applied between the second electrode layer 130 and a third electrode layer 150 as the input current is swept up from 0 A.

In the non-volatile memory device 2 of FIG. 6A, a turn-on hold current of the first switching element S10 is lower than a turn-on threshold current of the second switching element S20, consistent with the embodiment described above with reference to FIG. 4. As an example, the turn-on hold current of the first switching element S10 and the turn-on threshold current of the second switching element S20 may be set by controlling thicknesses of the first and second switching layers 120 and 140. That is, the first and second switching layers 120 and 140 have specific thicknesses and have a specific thickness ratio, so that the turn-on hold current of the first switching element S10 is lower than the turn-on threshold current of the second switching element S20.

Referring to FIG. 6B, a first graph 610 and a second graph 620 illustrate current-voltage characteristics of the non-volatile memory device 2.

The first graph 610 represents an output voltage of the non-volatile memory device 2 according to an input current of the non-volatile memory device 2 when the resistive memory device VR is in a low resistance state, e.g., when the resistive memory device VR is storing signal information corresponding to the low resistance state. In one embodiment, when the input current is swept up from 0 A and reaches a turn-on threshold current $I_{th}$, the switching device 1 may be turned on, and the non-volatile memory device 2 may undergo a snap-back phenomenon, in which the output voltage decreases from a turn-on threshold voltage $V_{th\text{-}610}$. Subsequently, when the input current increases from the threshold current $I_{th}$, the non-volatile memory device 2 may maintain a low resistance state, and the output voltage may gradually increase. When the input current is removed, the switching device 1 may be turned off, and the resistive memory device VR may maintain the low resistance state. That is, the resistive memory device VR may continue to store the signal information corresponding to the low resistance state after the input current is disconnected. The resistive memory device VR has a non-volatile memory characteristic.

The second graph 620 represents an output voltage of the non-volatile memory device 2 according to an input current of the non-volatile memory device 2 when the resistive memory device VR is in a high resistance state, e.g., when the resistive memory device VR is storing signal information corresponding to the high resistance state. In one embodiment, when the input current is swept up from 0 A and reaches the turn-on threshold current $I_{th}$, the switching device 1 may be turned on and may undergo a snap-back phenomenon. That is, the output voltage of the switching device 1 may decrease from a turn-on threshold voltage $V_{th\text{-}620}$ when the input current reaches the turn-on threshold current $I_{th}$. However, since the resistive memory device VR is in the high resistance state, the output voltage may gradually increase as the input current increases after the switching device 1 undergoes the snap-back phenomenon. When the input current reaches a set current $I_{S\text{-}620}$, the resistive memory device VR may undergo a set operation.

When the set operation occurs, the resistive memory device VR may switch from the high resistance state to a low resistance state. When the resistive memory device VR undergoes the set operation, the output voltage may decrease. The output voltage corresponding to the set current $I_{S\text{-}620}$ may be referred to as a set voltage $V_{S\text{-}620}$. Subsequently, when the input current is removed, the resistive memory device VR may maintain the low resistance state. That is, because the resistive memory device VR has a non-volatile memory characteristic, the resistive memory device VR may continue to store the signal information corresponding to the low resistance state after the input current is disconnected.

A read operation may be performed on the non-volatile memory device 2, in order to read information stored in the resistive memory device VR by determining the resistance state of the resistive memory device VR. The read operation may be performed by reading an operation current in the variable resistance layer 160 when a read voltage is applied to the non-volatile memory device 2 while the switching device 1 is turned on. In an embodiment, the reading operation may be effectively performed when the read voltage is within a range $\Delta V_{rd}$ including a first voltage range $V_s$ and a second voltage range $V_r$.

The first voltage range $V_s$ may be a range from the voltage $V_{th\text{-}610}$, at which the switching device 1 is turned on when the resistive memory device VR is in the low resistance state, to the voltage $V_{th\text{-}620}$, at which the switching device 1 is turned on when the resistive memory device VR is in the high resistance state. The second voltage range $V_r$ may be a range from the voltage $V_{th\text{-}620}$, at which the switching device 1 is turned on when the resistive memory device VR is in the high resistance state, to the voltage $V_{S\text{-}620}$, at which the resistive memory device VR switches to the low resistance state when the switching device 1 is turned on.

Figure 7A:
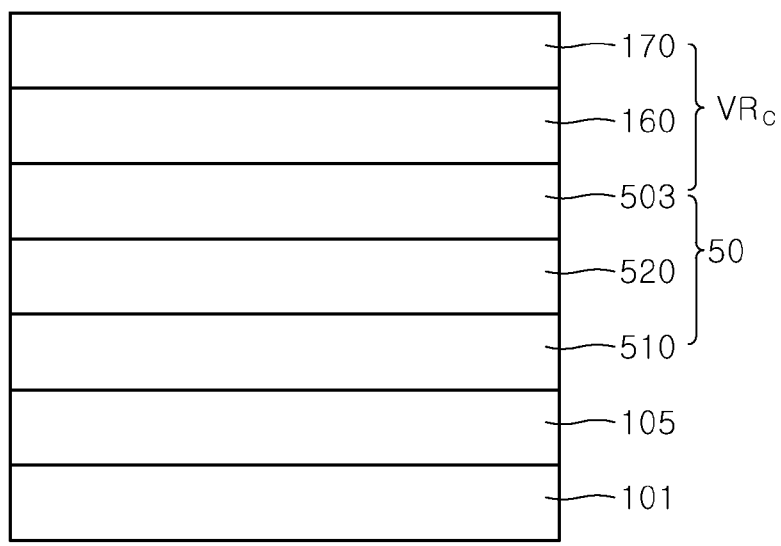
FIG. 7A is a cross-sectional view schematically illustrating a non-volatile memory device according to a comparative example of the present disclosure.

FIG. 7A is a cross-sectional view schematically illustrating a non-volatile memory device 3 according to a comparative example of the present disclosure. FIG. 7B is a graph illustrating a current-voltage characteristic of the non-volatile memory device 3 of FIG. 7A according to a comparative example of the present disclosure.

Referring to FIG. 7A, the non-volatile memory device 3 may include a switching device 50 and a resistive memory device $VR_c$. The switching device 50 may function as a selection device, and the resistive memory device $VR_c$ may function as a non-volatile memory device. The configuration of the switching device 50 of FIG. 7A may be substantially the same as the configuration of the switching device 50 described above with reference to FIGS. 5A and 5B. In addition, the configuration of the resistive memory device $VR_c$ of FIG. 7A may be substantially the same as the configuration of the resistive memory device VR described above with reference to FIGS. 6A and 6B.

Figure 7B:
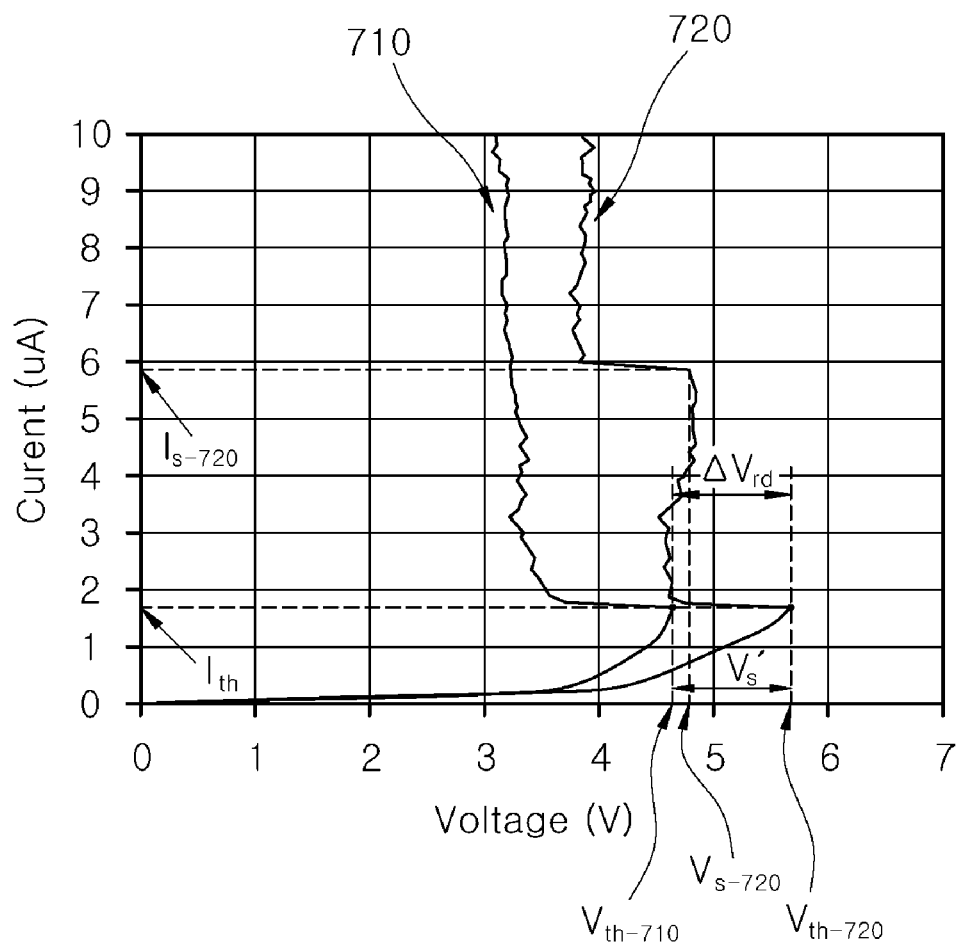
FIG. 7B is a graph illustrating a current-voltage characteristic of the non-volatile memory device of FIG. 7A according to a comparative example of the present disclosure.

Referring to FIG. 7B, a first graph 710 and a second graph 720 illustrate current-voltage characteristics of the non-volatile memory device 3.

The first graph 710 represents an output voltage of the non-volatile memory device 3 according to an input current of the non-volatile memory device 3, when the resistive memory device $VR_c$ is in a low resistance state, e.g., when the resistive memory device $VR_c$ stores signal information corresponding to the low resistance state. In one embodiment, when the input current is swept up from 0 A and reaches a turn-on threshold current $I_{th}$, the switching device 50 may be turned on, and the switching device 50 may undergo a snap-back phenomenon. That is, the output voltage suddenly decreases from a turn-on threshold voltage $V_{th-710}$ when the input current reaches the turn-on threshold current $I_{th}$. The non-volatile memory device 3 may maintain a low resistance state, in which the output voltage does not increase even if the input current increases. Meanwhile, when the input current is removed, the resistive memory device $VR_c$ may maintain the low resistance state. In other words, the resistive memory device $VR_c$ may continue to store the signal information corresponding to the low resistance state when the input current is disconnected from the non-volatile memory device 3.

The second graph 720 represents an output voltage of the non-volatile memory device 3 according to an input current of the non-volatile memory device 3, when the resistive memory device $VR_c$ is in a high resistance state, e.g., when the resistive memory device $VR_c$ stores signal information corresponding to the high resistance state. In one embodiment, when the input current is swept up from 0 A and reaches the turn-on threshold current $I_{th}$, the switching device 50 may be turned on and may undergo a snap-back phenomenon. That is, the output voltage suddenly decreases from a turn-on threshold voltage $V_{th-720}$ when the input current reaches the turn-on threshold current $I_{th}$. However, since the resistive memory device $VR_c$ is in the high resistance state, the output voltage may gradually increase as the input current increases after the switching device 50 undergoes the snap-back phenomenon.

When the input current is swept up from the turn-on threshold current $I_{th}$ and reaches a set current $I_{S-720}$, the resistive memory device $VR_c$ may undergo a set operation. That is, the resistive memory device $VR_c$ may switch from the high resistance state to the low resistance state. The output voltage may decrease when the resistive memory device $VR_c$ undergoes the set operation. The output voltage corresponding to the set current $I_{S-720}$ may be referred to as a set voltage $V_{S-720}$. Subsequently, when the input current is removed, the resistive memory device $VR_c$ may remain in the low resistance state. In other words, because the resistive memory device $VR_c$ has a non-volatile memory characteristic, the resistive memory device $VR_c$ may continue to store the signal information corresponding to the low resistance state after the input current is disconnected from the non-volatile memory device 3. In some embodiments, the set voltage $V_{S-720}$ of the resistive memory device $VR_c$ may be lower than the turn-on threshold voltage $V_{th-720}$ of the switching device 50, as illustrated.

A read operation, for reading information corresponding to the resistance state stored in the resistive memory device $VR_c$, is performed on the non-volatile memory device 3 by applying a read voltage to the non-volatile memory device 3. An effective read operation for the non-volatile memory device 3 may be performed using a read voltage within a first voltage range $V_s'$. The first voltage range $V_s'$ may be a range from the voltage $V_{th-710}$, at which the switching device 50 is turned on when the resistive memory device $V VR_c$ is in the low resistance state, to the voltage $V_{th-720}$, at which the switching device 50 is turned on when the resistive memory device $VR_c$ is in the high resistance state. As described above, since the set voltage $V_{S-720}$ of the resistive memory device $VR_c$ is lower than the turn-on threshold voltage $V_{th-720}$ of the switching device 50, a voltage range corresponding to the second voltage range $V_r$ of the current-voltage graph 620 of the non-volatile memory device 2, which is illustrated in FIG. 6B, does not appear in the current-voltage graph of the non-volatile memory device 3, which is illustrated in FIG. 7B. That is, the range of effective read voltages for the non-volatile memory device 3 illustrated in FIG. 7A does not exceed the turn-on threshold voltage $V_{th-720}$.

Therefore, even if the switching device 50 of the non-volatile memory device 3 has substantially the same turn-on threshold voltage as the switching device 1 of the non-volatile memory device 2, the read voltage range of the non-volatile memory device 3 may be narrower than the read voltage range of the non-volatile memory device 2, due to the difference in snap-back voltages.

As described above, a switching device according to an embodiment of the present disclosure can be employed as a selection device in a non-volatile memory device. Thus, a snap-back behavior of the selection device can be effectively suppressed while the selection device secures a relatively improved leakage current characteristic and a relatively improved turn-on current characteristic. As a result, it is possible to secure a relatively wide range of read voltages, at which an effective read operation is performed on the non-volatile memory device.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A switching device comprising:
 a first switching element having a snap-back behavior characteristic, an output voltage of the first switching element decreasing when an input current increases from a turn-on threshold current of the first switching element; and
 a second switching element having a continuous-resistance behavior characteristic, an output voltage of the second switching element increasing when the input current increases from a turn-on threshold current of the second switching element,
 wherein the turn-on threshold current of the first switching element is lower than the turn-on threshold current of the second switching element,
 wherein the first switching element comprises a first electrode layer, a first switching layer disposed on the first electrode layer, and a second electrode layer disposed on the first switching layer, and
 wherein the second switching element comprises the second electrode layer, a second switching layer disposed on the second electrode layer, and a third electrode layer disposed on the second switching layer.

2. The switching device of claim 1,
 wherein the first switching element and the second switching element are electrically connected to each other in series.

3. The switching device of claim 1,
 wherein the first switching element exhibits a snap back behavior when the input current is within a range, the second switching element being in a turn-off state when the input current is within the range.

4. The switching device of claim 1,
 wherein a turn-on hold current of the first switching element is lower than the turn-on threshold current of the second switching element.

5. The switching device of claim 1,
 wherein each of the first and second switching elements has a volatile switching characteristic.

6. The switching device of claim 1,
wherein the second switching element has a tunneling conduction characteristic.

7. The switching device of claim 1,
wherein the first switching layer comprises an oxide of a first element and a dopant of a second element, the dopant being distributed in the oxide of the first element.

8. The switching device of claim 7,
wherein a valence of the first element is different from a valence of the second element.

9. The switching device of claim 7,
wherein the oxide of the first element comprises one or more of silicon oxide, aluminum oxide, zirconium oxide, hafnium oxide, tungsten oxide, titanium oxide, nickel oxide, copper oxide, manganese oxide, tantalum oxide, niobium oxide, and iron oxide.

10. The switching device of claim 9,
wherein the second element comprises one or more of carbon (C), nitrogen (N), phosphorus (P), arsenic (As), aluminum (Al), lanthanum (La), niobium (Nb), vanadium (V), tantalum (Ta), tungsten (W), chromium (Cr), molybdenum (Mo), titanium (Ti), copper (Cu), zirconium (Zr), and hafnium (Hf).

11. The switching device of claim 1,
wherein the second switching layer comprises a metal oxide that satisfies a stoichiometric ratio.

12. The switching device of claim 11,
wherein the metal oxide comprises one or more of titanium oxide, aluminum oxide, nickel oxide, copper oxide, zirconium oxide, manganese oxide, hafnium oxide, tungsten oxide, tantalum oxide, niobium oxide, and iron oxide.

13. The switching device of claim 1,
wherein one or more of the first to third electrode layers comprise one or more of tungsten (W), aluminum (Al), copper (Cu), tantalum (Ta), titanium (Ti), gold (Au), platinum (Pt), silver (Ag), ruthenium (Ru), iridium (Ir), molybdenum (Mo), tungsten nitride, titanium nitride, tantalum nitride, and doped silicon.

14. A switching device comprising:
a first electrode layer; and
a first switching layer, a second electrode layer, a second switching layer, and a third electrode layer, which are stacked on the first electrode layer,
wherein the first switching layer comprises an oxide of a first element and a dopant of a second element, the dopant being distributed in the oxide of the first element, the second switching layer comprising a metal oxide that satisfies a stoichiometric ratio, and
wherein the switching device has a volatile switching characteristic.

15. The switching device of claim 14,
wherein the oxide of the first element comprises one or more of silicon oxide, aluminum oxide, zirconium oxide, hafnium oxide, tungsten oxide, titanium oxide, nickel oxide, copper oxide, manganese oxide, tantalum oxide, niobium oxide, and iron oxide, and
wherein the second element comprises one or more of carbon (C), nitrogen (N), phosphorus (P), arsenic (As), aluminum (Al), lanthanum (La), niobium (Nb), vanadium (V), tantalum (Ta), tungsten (W), chromium (Cr), molybdenum (Mo), titanium (Ti), copper (Cu), zirconium (Zr), and hafnium (Hf).

16. The switching device of claim 14,
wherein the metal oxide comprises one or more of titanium oxide, aluminum oxide, nickel oxide, copper oxide, zirconium oxide, manganese oxide, hafnium oxide, tungsten oxide, tantalum oxide, niobium oxide, and iron oxide.

17. A non-volatile memory device comprising:
a first switching element;
a second switching element; and
a resistive memory device,
wherein the first switching element, the second switching element, and the resistive memory device are connected to each other in series,
wherein the first switching element comprises:
a first electrode layer;
a first switching layer disposed on the first electrode layer; and
a second electrode layer disposed on the first switching layer,
wherein the first switching element exhibits a snap-back behavior characteristic, an output voltage of the first switching element decreasing when an input current increases from a turn-on threshold current of the first switching element,
wherein the second switching element comprises:
the second electrode layer;
a second switching layer disposed on the second electrode layer; and
a third electrode layer disposed on the second switching layer,
wherein the second switching element has a continuous-resistance behavior characteristic, an output voltage of the second switching element increasing when the input current increases from a turn-on threshold current of the second switching element, and
wherein the resistive memory device comprises:
the third electrode layer;
a variable resistance layer disposed on the third electrode layer; and
a fourth electrode layer disposed on the variable resistance layer.

18. The non-volatile memory device of claim 17,
wherein a turn-on hold current of the first switching element is lower than the turn-on threshold current of the second switching element.

19. The non-volatile memory device of claim 17,
wherein each of the first and second switching elements has a volatile switching characteristic.

20. The non-volatile memory device of claim 17,
wherein the first switching element exhibits a snap-back behavior when the input current is within a range, the second switching element maintaining a turn-off state when the input current is within the range.

* * * * *